US009484915B2

(12) United States Patent
Felth et al.

(10) Patent No.: US 9,484,915 B2
(45) Date of Patent: Nov. 1, 2016

(54) NON-CONTACT PROXIMITY SWITCH FOR MACHINE SAFETY (71) Applicant: ABB Schweiz AG, Baden (CH)

(72) Inventors: Lars-Magnus Felth, Fjärås (SE);
Ingvar Gillholm, Kungsbacka (SE);
Andreas Henriksson, Göteborg (SE);
Lars Regner, Kungsbacka (SE);
Nicklas Alnström, Kungsbacka (SE)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 14/892,104

(22) PCT Filed: May 20, 2013

(86) PCT No.: PCT/EP2013/060331
§ 371 (c)(1),
(2) Date: Nov. 18, 2015

(87) PCT Pub. No.: WO2014/187469
PCT Pub. Date: Nov. 27, 2014

(65) Prior Publication Data
US 2016/0094220 A1 Mar. 31, 2016

(51) Int. Cl.
*H03K 17/945* (2006.01)
*F16P 3/14* (2006.01)
(52) U.S. Cl.
CPC ............ *H03K 17/945* (2013.01); *F16P 3/14* (2013.01)
(58) Field of Classification Search
CPC .................................. H03K 17/945; F16P 3/14
USPC ........................................................ 307/326
See application file for complete search history.

(56) References Cited

U.S. PATENT DOCUMENTS

| 5,493,278 A | * | 2/1996 | Mackenzie | .......... G08B 21/185 335/17 |
| 2011/0238339 A1 | * | 9/2011 | Fericean | .............. H03K 17/945 702/58 |
| 2012/0152072 A1 | * | 6/2012 | Buchanan | ................ B26D 7/24 83/58 |

FOREIGN PATENT DOCUMENTS

| CN | 201130930 Y | 10/2008 |
| CN | 201674475 U | 12/2010 |

(Continued)

OTHER PUBLICATIONS

Internation Preliminary Report on Patentability Application No. PCT/EP2013/060331 Issued: May 4, 2015 7 pages.

(Continued)

*Primary Examiner* — Jared Fureman
*Assistant Examiner* — Michael Warmflash
(74) *Attorney, Agent, or Firm* — Whitmyer IP Group LLC (57) ABSTRACT

A non-contact proximity switch having a first part and a second part which do not need to be in physical contact to detect proximity of the first and second parts. The first part is arranged to be connected to a reset circuit including an indicator light and a reset switch having a reset button. The first part includes a reset mechanism for machine safety, and the reset mechanism includes a signal generator and a signal detector. The reset mechanism is arranged to, upon indication that a reset is required, generate a signal so as to switch-on said indicator light, and the reset mechanism is further arranged to detect when the state of a connected reset switch corresponds to a state where the reset button is being pressed.

12 Claims, 5 Drawing Sheets

(56) References Cited

FOREIGN PATENT DOCUMENTS

| GB | 2177216 A | | 1/1987 | | |
|---|---|---|---|---|---|
| GB | 2206662 A | * | 1/1989 | ............. | A01D 75/20 |
| WO | WO 2004114492 A2 | * | 12/2004 | ............... | H02H 3/00 |

OTHER PUBLICATIONS

International Search Report and Written Opinion of the International Searching Authority Application No. PCT/EP2013/060331 Completed: Sep. 19, 2013;Mailing Date: Sep. 27, 2013 12 pages.

* cited by examiner

NON-CONTACT PROXIMITY SWITCH FOR MACHINE SAFETY

FIELD OF THE INVENTION

The present invention relates to the field of machine safety, and in particular to non-contact proximity switches for machine safety.

BACKGROUND OF THE INVENTION

When operating electrical and mechanical machines, it is important to ensure that the risk for accidents is minimized. In many applications, information on whether two different parts are in the vicinity of each other is of importance. For example, in many applications, it is important to know whether a lid or door to a machine has been opened or not, or if machine parts are in the correct position. An area wherein a dangerous machine is located can be enclosed by walls or by a fence, and information on whether or not the area has been entered by a person may be of importance for determining whether or not it is safe to operate the machine.

Proximity switches are typically used as position detectors which can detect whether one part is in the vicinity of another part. A proximity switch is a device which comprises two parts, and which detects when the two parts are in proximity of each other. A non-contact proximity switch is a proximity switch wherein the two parts do not need to be in contact with each other to detect proximity of the two parts. An example of a non-contact proximity switch is a radio-operated proximity switch, wherein the first part sends a radio signal as a query signal, which is detected by the second part if in proximity of the first part. The second part then sends a radio signal as a response signal, which is detected by the first part. Proximity of the two parts can thus be verified. The second part is sometimes referred to as the actuating part.

The present invention relates to an improved proximity switch, by which the operation of a machine safety system will be more efficient.

US 2012/152072 A1 discloses a safety system preventing an operator of a cutting machine from being accidentally carried through the infeed chute into the machine's cutting mechanism. By providing the operator a safety device, mounting a sensor array on opposing sides of the cutting machine's infeed chute, the magnetic field of the safety device is able to induce a current in the sensor array as it moves in the proximity of the sensor array. The safety system generates a signal which is proportional to the sum of the induced currents. When the signal exceeds a threshold, the safety system shuts off power to the feed mechanism and/or the cutting blades of the cutting machine, preventing injury to the operator.

SUMMARY OF THE INVENTION

A problem to which the present invention relates is how to improve the efficiency of the operation of a machine safety system comprising proximity switches.

One embodiment provides a non-contact proximity switch having a first part and a second part, wherein the first part is arranged to be connected to a reset circuit comprising an indicator light and a reset switch having a reset button. The first part and the second part do not need to be in physical contact in order to detect proximity, and are typically not physically connected to each other. The first part comprises a reset mechanism for machine safety. The reset mechanism comprises a signal generator and a signal detector. The signal generator is arranged to, upon indication that a reset is required, generate a signal so as to switch-on said indicator light. The signal detector is arranged to detect when the state of a connected reset switch corresponds to a state where the reset button is being pressed.

By providing a non-contact proximity comprising reset mechanism, a non-contact proximity switch can be equipped with a dedicated reset button in an efficient manner. Therefore, when the non-contact proximity switch has been opened, staff operating the non-contact proximity switch can quickly perform a reset operation directly after having closed the non-contact proximity switch. Time and effort can thereby be saved.

The non-contact proximity switch often comprises a housing which houses the reset mechanism; and a receiver for receiving a response signal from the second part.

The first part of the non-contact proximity switch typically comprises a first I/O interface arranged to be connected to said reset circuit. In one embodiment, the reset mechanism is arranged to, upon a detected absence of a response signal from the second part: alter the output from the signal generator so that a signal at an output of said first I/O interface changes; detect a re-appearing response signal from the second part; and detect a reset operation, the detection comprising detecting, in the signal detector, that a signal at an input of the I/O interface has changed to a signal, which corresponds to the reset button being pressed.

In one embodiment wherein the first part comprises a first I/O interface arranged to be connected to said reset circuit; and the output and the input of the first I/O interface share a common physical connection point. An output of the signal generator and an input of the signal detector are connected to said common connection point. Hereby is achieved that the space required for I/O interfaces on the non-contact proximity switch is reduced.

In one embodiment wherein the first part comprises a first I/O interface arranged to be connected to said reset circuit, said reset mechanism is arranged to, upon a detected absence of a response signal from the second part, generate a modulated signal at an output of the first I/O interface. By providing a modulated signal as the reset-state output signal, a pressed-down state of a connected reset circuit can more easily be distinguished from the reset state when the reset button is not being pressed. since the dynamics of the signals, rather than (or in addition to) the magnitude of the signals, can be analyzed. A modulated reset-state output could also be beneficial in order to reduce the risk that a false signal at the I/O terminal 301 is detected as a reset operation.

In one embodiment, the non-contact proximity switch of comprises a signal generator (arranged to generate a CLOSED-signal, at a second I/O interface, in response to the reset mechanism having detected a re-appearing response signal and a detected reset operation. Typically, this signal generator is arranged to only generate a CLOSED-signal if both an input signal and a response signal has been received, the response signal either having been received when expected, or if received later, the received response signal was followed by a detected reset operation. Hereby is achieved that a CLOSED-signal will only be generated when the proximity switch, as well as any further proximity switches to which the proximity switch is connected, are closed. This signal generator and the signal generator arranged to generate a signal so as to switch of the indicator light of a connected reset circuit could, if desired, be implemented as the same physical generator.

In one implementation, the reset mechanism is at least partly implemented by means of at least one processor.

Further aspects of the invention are set out in the following detailed description and in the accompanying claims.

DETAILED DESCRIPTION OF THE INVENTION

Figure 1:
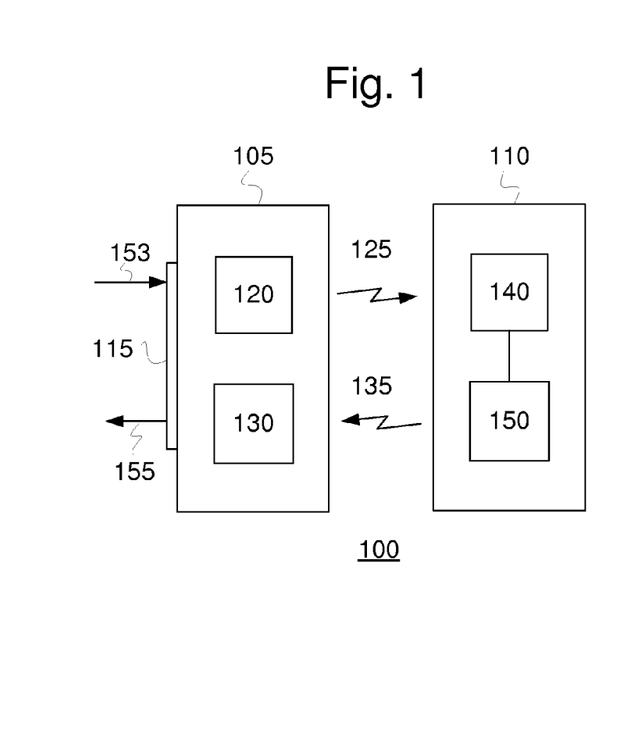
FIG. 1 is an illustration of a prior art non-contact proximity switch having a first and a second part.

An example of a prior art proximity switch 100 is shown in FIG. 1. The proximity switch 100 comprises a first part 105 and a second part 110 which are not physically connected to each other. The first part 105 has an external I/O interface 115, via which communication with a safety controller (not shown) and/or other proximity switches 100 can take place. The first part 105 of FIG. 1 further comprises a transmitter 120 arranged to transmit a query signal 125 to the second part 110, as well as receiver 130 arranged to receive a response signal 135 sent by the second part 110. The second part 110 in turn comprises a receiver 140 arranged to receive a query signal 125 generated by the first part 105, and a transmitter 150 arranged to transmit a response signal 135 in response to the receiver 140 having received a query signal 125.

The first part 105 is arranged to receive an input signal 153 at I/O interface 115, for example from a safety controller or another proximity switch 100. The input signal 153 could for example be a CLOSED-signal from another proximity switch 100, indicating that the other proximity switch 100 is closed. The first part 105 is further arranged to output a CLOSED-signal 155 at the I/O interface 115. Typically, the first part 105 is arranged to output a CLOSED-signal 155 only if having received an input signal 153 prompting for the generation of a CLOSED-signal 155 AND a response signal 135 has been received by the second part 110.

The first part of the proximity switch 100 is, when in use, fixed onto a first part of a device to be monitored, whereas the second part of the proximity switch is fixed onto a second part of the device to be monitored, where the first part of the monitored device is moveable in relation to the second part of the monitored device. As mentioned before, the device to be monitored could for example be a door, a lid, or moveable machine parts. For example, when a door is to be monitored, a first part can be fixed on the door post, while the second part is fixed on the door itself.

When the first part 110 of a proximity switch 100 does not receive any response signal 135 from the second part 110, the proximity switch 100 will in the following said to be in the open state. Similarly, when the first part 105 does receive a response signal 135, the proximity switch 100 will be said to be in the closed state.

When a proximity switch which monitors a door or a lid is in the open state, any machine located inside the area enclosed by use of the door or lid will typically be stopped. Similarly, when a proximity switch which monitors the position of machine parts detects that the machine parts are out of position, the machine will typically be stopped.

After a proximity switch has been opened, it is often of importance to know, not only that the monitored device is in position again, but also that a human being has determined that it would be safe to re-start any machine which is monitored by the proximity switch, for example a machine within an area closed by a door which is monitored by the proximity switch. In such circumstances, the proximity switch is often combined with a reset circuit. The reset circuit is used for detecting a manual indication that it would be safe to take the machine into operation again, when the proximity switch is once again in the closed state after a stop. A reset circuit typically comprises an indicator light and a reset switch, where the reset switch is equipped with a reset button. The reset circuit is arranged to generate an indication when the reset button is being pressed, so that a pressed-down state of the reset button can be distinguished from the normal (released) state of the reset button.

Figure 2:
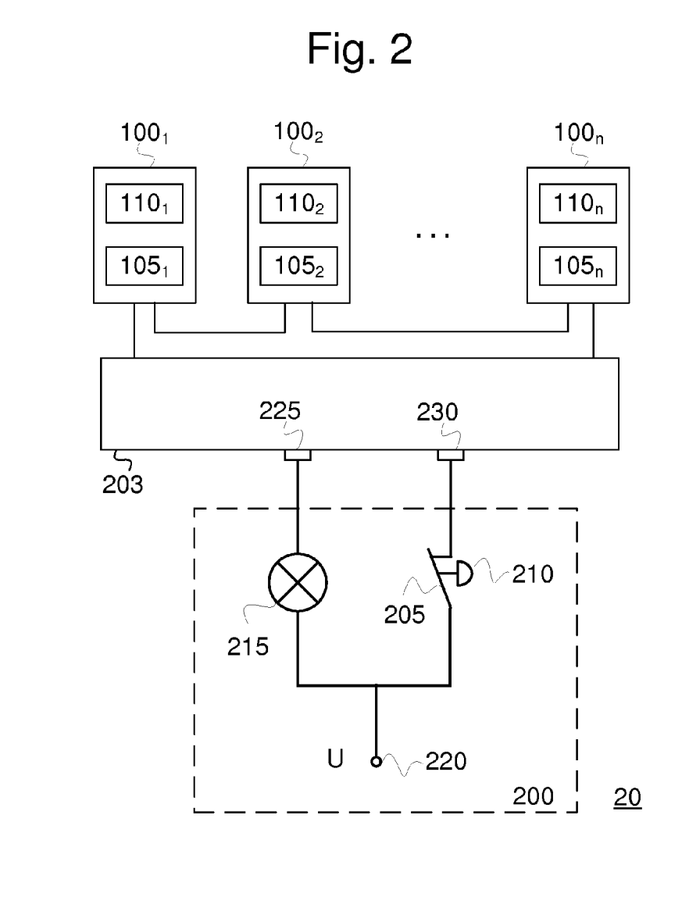
FIG. 2 is an illustration of a machine safety control system which includes a plurality of prior art proximity switches connected to a safety controller equipped with a reset button.

An example of a machine safety control system 20 which includes a reset circuit 200, a safety controller 203 and a plurality of proximity switches $100_1$ to $100_n$ is shown in FIG. 2. In the design of FIG. 2, the plurality of proximity switches 100 are series-connected into a series of proximity switches 100, where two end proximity switches, $100_1$ and $100_n$, are further connected to the safety controller 203.

The reset circuit 200 is also connected to the safety controller 203. The reset circuit 200 of FIG. 2 is given as an example only, and several other designs of reset circuits 200 exist.

A reset circuit 200 is typically connected such that that a voltage can be selectively applied across the indicator light 215 by changing the potential at one connection point of the indicator light 215, so that the indicator light 215 can be turned on to indicate that there is a need to press the reset button 210. Furthermore, a reset circuit 200 is typically connected such that the potential at a connection point of the reset circuit 200 is altered when the reset button 210 is being pressed, so that a pressed-down state can be recognized as a particular potential at this connection point. When the indicator light is turned-off, the reset circuit 200 is said to be in the normal state, while when the indicator light is turned on, but the reset button 210 is released, the reset circuit 200 is said to be in the reset state. When the reset button 210 is being pressed, the reset circuit 200 is said to be in the pressed-down state.

In the reset circuit of FIG. 2, a first end of an indicator light 215 and a first end of a reset switch 205 are connected to the same voltage-source terminal 220, connectable to a voltage source of voltage U (not shown), where U could be any potential (including ground). The second end of the indicator light 215 is connected to a connection point 225 of the safety controller 203; while the second end of the reset switch 205 is connected to a connection point 230 of safety controller 203. By applying, at the connection point 225, a signal of the same potential U at the voltage-source connection 220, the indicator light 215 will be turned off. By applying a potential at the connection point 225, which differs from the potential U at the voltage source connection 220, the indicator light 225 can be turned on.

Thus, in the normal state of the reset circuit 200, the output 225 and the voltage-source terminal 220 of FIG. 2 will typically be at the same potential, so that the light 215 will be turned off. In the reset state, which will be entered for example if a proximity switch 100 connected to the safety controller 203 has been opened, the safety controller 203 will set the output 225 to a different potential, thus causing the indicator light 215 to light up, thus informing the staff that the reset-button 210 needs to be pushed. When the reset button 210 of the reset circuit 200 of FIG. 2 is pushed, the reset switch 205 will be opened, and the potential at input 230 will go from U to another potential, typically a floating potential. When the reset button 210 is released, the potential at input 230 will go back to U. Thus, the safety controller 203 can thus detect that the reset button 210 has been pushed. Typically, the release of the reset button 210 is used as an indication to the safety controller 203 that the machine can be returned to its operating state. In the circuit of FIG. 2, this corresponds to a return of the potential at the input 230 to the potential U.

As mentioned above, there are many designs of a reset circuit 200, and the reset circuit of FIG. 2 is an example only. For example, the reset switch 210 could be of normally-closed type, as in FIG. 2, or of normally-open type. The potential U could be ground potential, or a different potential. In one embodiment, a reset circuit 200 could be designed such that the connection point 225 connected to the indicator light 215 and the connection point 230 connected to the reset switch are implemented as the same physical connection point, as will be further described in relation to FIG. 5.

The safety controller 203 of FIG. 2 is arranged to determine whether any of the non-contact proximity switches 100₁ to 100ₙ are in the open state, and if so, to stop any dangerous machines which are being monitored by the open proximity switches 100. Such determination could for example be performed by detecting the absence of an expected CLOSED-signal 155. Furthermore, after having determined that a proximity switch 100 is open, the safety controller 203 is arranged to turn on the indicator light 215 by changing the potential at output 225; and await a CLOSED-signal 155 from the opened proximity switches 100 AND a detected reset at the input 230. The safety controller 203 is arranged to allow a re-start of the previously stopped machines upon receipt of reset signal at connection point 230 after receipt of a CLOSED-signal 155. Hence, a human decision to press the reset button is required for the machine to be able to restart, thus reducing the risk of accidents.

In the machine-safety control system of FIG. 2, a single reset button 210 is used for the resetting of a plurality of different proximity switches 100. Oftentimes, the different proximity switches 200 are far apart, and staff has to walk a fair distance between a proximity switch 100 and the reset button 210. A more efficient machine-safety control system is desired.

According to the invention, a non-contact proximity switch with integrated reset functionality is provided. Hereby, a reset button can be provided for each proximity switch. Hence, the reset button can be located at the same location as the machine which is being monitored by the proximity switch. This is highly advantageous in a machine safety system which includes more than sensor: The machine safety system operating staff will save time, since a reset operation can be performed at the same time as ensuring that it would be safe to restart the machine, and no delay due to staff having to walk to the reset button will be needed.

Figure 3:
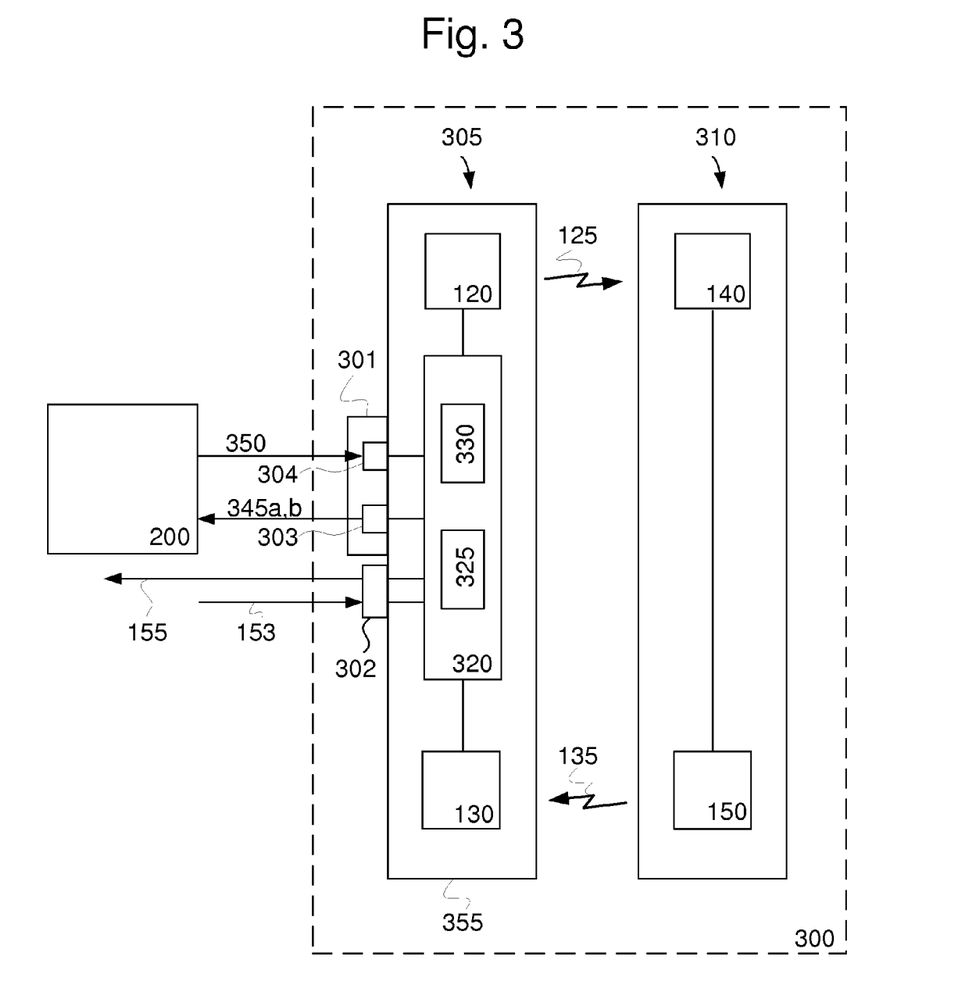
FIG. 3 illustrates an embodiment of a proximity switch according to the invention.

In FIG. 3, an embodiment of a non-contact proximity switch 300 according to the invention is shown. The proximity switch 300 comprises a first part 305 and a second part 310. The first part 305 comprises a transmitter 120 arranged to transmit a query signal 125 to the second part 310, as well as receiver 130 arranged to receive a response signal 135 sent by the second part 310. The second part 310 in turn comprises a receiver 140 arranged to receive a query signal 125 generated by the first part 105, and a transmitter 150 arranged to transmit a response signal 135 in response to the receiver 140 having received a query signal 125. The second part 310 could, if desired, be implemented in the same manner as the second part 110 of the prior art proximity switch 100.

The first part 305 of the proximity switch 300 further has a first I/O interface 301 arranged to be electrically connected to a reset circuit 200 comprising an indicator light 215 and a reset switch 205. The first I/O interface 301 will be referred to as a reset interface 301. An example of a reset circuit 200 is shown in FIG. 2. Some reset circuit designs, e.g. that shown in FIG. 2, require that I/O interface 301 includes two connection points, whereas other designs, such as the one discussed below in relation to FIG. 5, require only one connection point. In yet other designs, reset interface 301 is a data bus connection, as described below. For illustration purposes only, the following description will be made in terms of the I/O interface 301 comprising separate connection terminals 303 and 304 for connection to an indicator light 215 and a reset switch 205, respectively, of a reset circuit 200. Connection terminal 303 will be referred to as an output 303, and connection terminal 304 will be referred to as an input 304.

The first part 305 of FIG. 3 further has a second I/O interface 302, via which communication with a safety controller and/or other proximity switches can take place. The second I/O interface 302 will be referred to as a communications interface 302.

Furthermore, the first part 305 further comprises a reset mechanism 320, which is arranged to operate a reset circuit 200 which is connected to the proximity switch 300 via reset interface 301.

Reset mechanism 320 comprises a signal generator 325 and a signal detector 330. As described above in relation to FIG. 2, a reset circuit can be in at least two different states: The normal state, when the indicator light 215 is turned off, and the reset state, when a reset operation is required and the indicator light 215 is turned on. Signal generator 325 is arranged to generate, when a connected reset circuit 200 is to be in the normal state, an output signal 345 at the connection point 303 which does not cause the indicator light 215 to light up. Oftentimes, this output signal 345*a* is a signal of the potential applied at the voltage-connection 220 at the other end of the indicator light 215. This signal will be referred to as the normal-state output signal 345*a*. Furthermore, signal generator 325 is arranged to generate, when a connected reset circuit 200 is to be in the reset state, an output signal 345 at the connection point 303 which differs from the potential at the voltage-connection 220 at the other end of indicator light 115, in order to switch on the indicator light 215 of a connected reset circuit 200, in order to switch on the indicator light 215 of a connected reset circuit 200. Such signal, which will be referred to as a reset-state output signal 345*b*, could for example be a steady potential which differs from the normal-state potential (for example within the range of −50 V to 50 V); a modulated signal causing the potential at connection point 303 to alternate between two values (for example, two values which are both within the range of −50 V to 50 V); a digital signal for transmission on a data bus, etc. In one example, the indicator light 215 is connected at the other end to a voltage source of 24 V, and the reset-state output signal 345*b* is 0 V. In another embodiment, the reset-state output signal is a modulated signal which goes between 0 V and 24 V, while the indicator light 215 is connected at the other end to a voltage source of 0 V. The voltage levels are given as examples only, and any voltage levels may be used.

Signal detector 330 is arranged to detect a reset operation. This typically involves detecting if the potential at input 304 changes to a value expected when the reset button 210 is being pressed, and whether the potential stays at such expected value for a time exceeding a predetermined period of time. In some implementations, the return of the potential at input 304 to a value expected when the reset button 210 is released is also required for the signal detector 330 to detect a reset operation.

Proximity switch 300 often forms part of a machine safety system 20. Proximity switch 300 is arranged to communicate, via communications interface 302, with other parts of the machine safety system, such as with other proximity switches 300; with sensors of other types; and/or with a safety controller. Proximity switch 300 is typically arranged to receive, via communications interface 302, an input signal 153 prompting for the generation of a CLOSED-signal 155. Input signal 153 could for example be a signal from another proximity switch 300, indicating that the other proximity switch is in the closed state; or a signal from a safety controller 203. Proximity switch is further typically arranged to generate, at an output of communications interface 302, an output CLOSED-signal 155, when certain criteria have been fulfilled: In order for a CLOSED-signal to be generated, an input signal 153, prompting for the generation of a CLOSED-signal, will typically first have to be received at an expected point in time. Furthermore, a response signal 135 will have to be received at the expected point in time, or, if the response signal 135 was not received at the expected point in time but was received at a later point in time, a reset will have to be detected after said later point in time.

Thus, the reset mechanism 320 of the proximity switch 300 of FIG. 3 is arranged to generate a CLOSED signal 155 at the communications interface 302 if both an input signal 153 has been received, AND a response signal 135 has been received, either when expected, or if received later, the received response signal 135 was followed by a detected reset operation.

Figure 6:
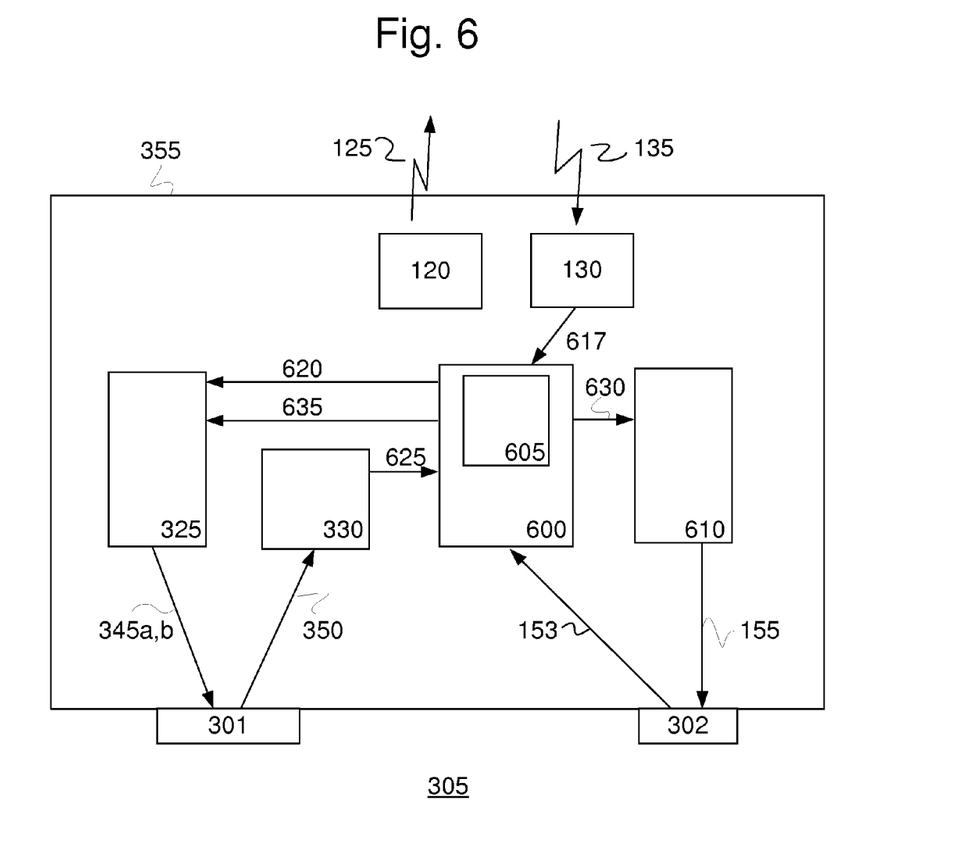
FIG. 6 is an alternative illustration of an embodiment of a first part of a proximity switch.

The generation of the CLOSED-signal 155 could be performed, as in FIG. 3, by the signal generator 325 arranged to generate a signal at connection point 302, or by a separate signal generator (cf. FIG. 6).

The output of I/O interface 302 could for example be a voltage terminal to which a predetermined potential is applied to generate a CLOSED-signal 355, or a data bus connection to which a digital signal, carrying information representing the CLOSED-signal 355, is applied.

The different functions of the first part 305 are shown in FIG. 3 to be physically included in the same housing 355, thus minimizing the amount of cables required for the installation of the proximity switch, as well as reducing the risk of erroneous installation.

Figure 4:
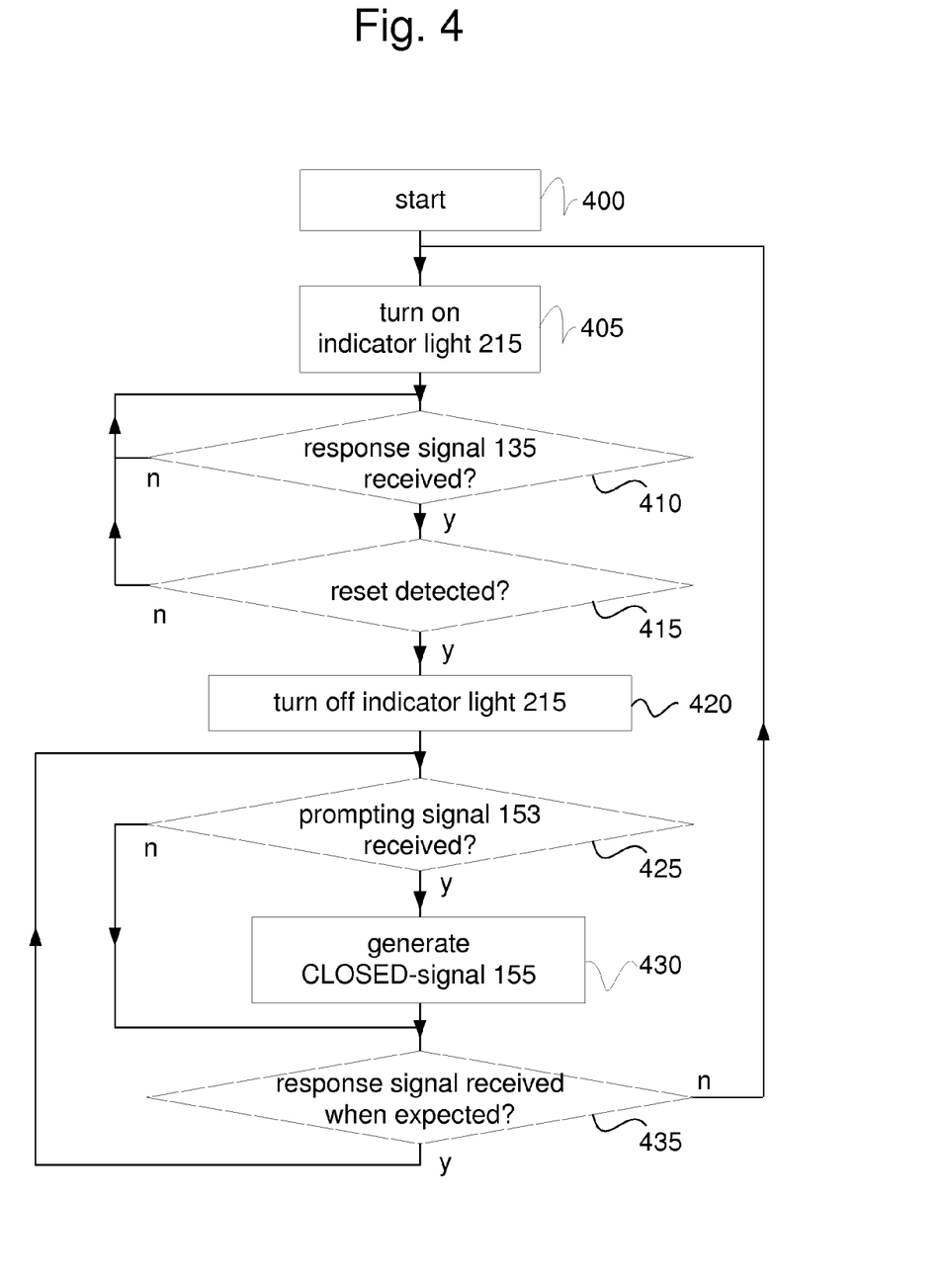
FIG. 4 is a flowchart illustrating an embodiment of a method of operating a first part of a proximity switch.

FIG. 4 is a flowchart schematically illustrating the operation of an embodiment of the first part 305 of a proximity switch 300. For illustration purposes, the following description will be made in terms of a proximity switch having a reset interface 301 including a first connection point 303 which is electrically connected with an indicator light 215 and a second connection point 304 which is electrically connected to a reset switch 205.

At step 400, the proximity switch is switched on. At step 405, a signal is generated at connection point 303 so as to turn on the indicator light 215 of the connected reset circuit 200. As described above, the signal could for example be a potential which is different to the normal-state potential of the connection point 303, so as to generate a voltage drop over an indicator light 215 of a connected reset circuit 200, thus switching the indicator light 215 on. At step 410, it is then checked whether a response signal 135 has been received by the first part 305 from the second part 310. If not, step 410 is re-entered. When a response signal 135 has been received, step 415 is entered, wherein a reset operation is awaited. If no reset is detected within a predetermined period of time, step 410 can be re-entered, as shown in FIG. 4, in order to ensure that the proximity switch 300 has not been opened while awaiting a reset operation.

Typically, a reset operation is performed by pressing the reset button 210 of a connected reset circuit during at least a predetermined period of time. The pressing of a reset button 210 which is connected to the proximity switch 300 will cause a change in the potential at connection point 304. In one implementation, a reset operation will be detected when the potential at connection point 304 has been, for a duration of the predetermined period of time, or longer, at a value expected when the reset button 210 is being pressed. In another implementation, a reset operation will be detected when the potential at connection point 304 returns to its normal-state value, after having been, for the predetermined period of time, or longer, at the value expected when the reset button 210 is being pressed. The predetermined period of time is typically selected to correspond to the duration of a normal pressing of a reset button 110, such as for example within the range of 10 ms-1 s.

When a reset operation has been detected in step 415, step 420 is then entered, wherein the indicator light 125 is turned off. This typically includes returning the potential at connection point 303 to the normal-state potential of the connection point 303, but could alternatively, depending on implementation, instead involve the sending of a digital signal the contents of which represents an instruction to turn off the indicator light 215.

Step 425 is then entered, wherein it is checked whether a prompting signal 153 has been received by proximity switch 300 at the communications interface 302, such prompting signal 153 indicating e.g. that any further sensors to which the proximity switch 300 is connected are in a normal state, or that a safety controller 203 is awaiting a CLOSED-signal 155. If such prompting signal 153 has been received, step 430 is entered, wherein a CLOSED-signal 155 is output at communications interface 302. The CLOSED-signal 155 will indicate to a receiver that it is safe to operate a machine which is being monitored by the proximity switch 400.

The first part 305 of proximity switch 300 is further arranged to periodically send a query signal 125 to the second part 310 while the method of FIG. 4 is being executed. The transmitter 120 of the first part 305 is typically arranged to periodically send a query signal 125, with a period which could for example lie in the range of 1 ms-100 ms, for example every 5 or 10 ms, depending on application. Thus, response signals 135 are expected at the same frequency as the query signal 125 are being generated. When a CLOSED-signal 155 has been generated in step 430, step 435 is entered, wherein it is checked whether a response signal 135 has been received from the second part at the expected point in time. If so, step 425 is re-entered. However, if no response signal is received at the expected point in time, step 405 is re-entered. Thus, a response signal 135 which is received at any other time than the time expected from the periodic transmission of query signals 135 will cause the first part 305 to enter step 405 of FIG. 4.

If no prompting signal 153 is received in step 425, step 435 is entered directly after step 425, without generating any CLOSED-signal 155. By entering step 435 when no prompting signal is received, it is ensured that it will be detected if the proximity switch 300 is opened while waiting for a prompting signal 153.

The flowchart of FIG. 4 could be altered in many ways. For example, step 410 could be performed before step 405. If the communications interface 302 is not connected to any further sensors from which the proximity switch should await a prompting signal 153, step 425 could be omitted. A further step could for example be introduced between step 410 and step 415, in which the indicator light 215 is caused to flash to attract attention of staff, so that they will know that the proximity switch has re-entered the closed state and a reset operation is required.

If desired, a signal which indicates the absence of a response signal 135 could be generated at the output of communications interface 302, if no reset has been detected in step 420 after a certain period of time. However, in many implementations of a machine safety system, the absence of a CLOSED-signal 155 will cause the safety controller 203 to initiate a machine stop, and no signal indicating such absence is required.

As mentioned above, the first part 305 of proximity switch 300 could be arranged to operate a reset circuit via a reset interface 301 having a single point of connection, i.e. an I/O interface 301 wherein the connection points 303 and 304 coincide. An example of a reset circuit 200 which can be operated by such embodiment of the proximity switch 300 is given in relation to FIG. 5 below. In yet another implementation, wherein the circuit 200 is connected to I/O interface 301 via a further control circuit, the signal generated at the I/O interface 301 in steps 405 and 420 could be digital signals, the content of which can be interpreted by said control circuit as an indication to switch on or switch-off the indicator light 215, respectively.

Figure 5:
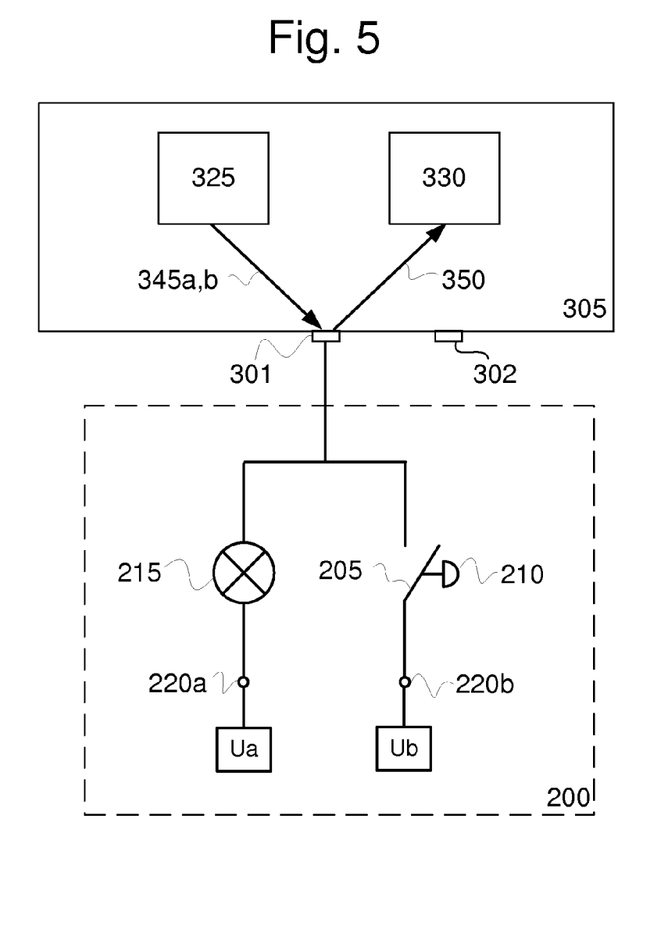
FIG. 5 is an illustration of an embodiment of a first part of a proximity switch capable of operating a reset circuit via a single connection point.

FIG. 5 illustrates an embodiment wherein a first part 305 of a proximity switch 300 is connected to a of a reset circuit 200 in which the indicator light 215 and the reset switch are arranged to be connected to the same connection point: A first end of the indicator light 215 is connected to a first end of the reset switch 210, and both are connectable to the I/O interface 301 of the proximity switch 300. The other end of the indicator light 215 is connected to a voltage-source of voltage Ua via voltage-source terminal 220a, while the other end of the reset switch 210 is connected to a voltage source of voltage Ub via voltage-source terminal 220b. The reset switch 205 in this embodiment of is a normally-open switch, which will be closed when the reset button 210 is being pressed. The voltage sources Ua and Ub could be the same, or different, voltage sources.

Hence, in an embodiment of the proximity switch 300 which is arranged to be connected to the reset circuit 200 of FIG. 5, the I/O interface 301 can be a single connection point. In order to provide for both the possibility of switching on the indicator light 215, and the possibility of detecting a reset operation, the output of signal generator 325 and the input of signal detector 330 are both connected to the signal connection point of I/O interface 301. The signal detector 330 is in turn arranged to detect a signal 350 corresponding to the potential at the connection point 301. Oftentimes, the signal generator is a current limited signal generator. This is practical in many implementations, and also when the output signal generator is connected to the reset switch 205.

In one embodiment of the proximity switch 300 of FIG. 5, the signal generator 325 is arranged to generate a modulated signal as the reset-state output signal 345b. By providing a modulated signal as the reset-state output signal 345b, a pressed-down state of a connected reset circuit 200 can more easily be distinguished from the reset state when the reset button is not being pressed: In the pressed-down state, the input signal 350 corresponding to the potential at the single point interface 301 will take the value of the potential of the voltage source Ub connected at connection point 220b, which is typically a DC potential. In the reset-state when the reset button 210 is not being pressed, on the other hand, the input signal 350 will be a modulated signal. Thus, in order to distinguish between a pressed-down state and a released state of the reset button 210 in the reset-state, the dynamics of the signal, rather than (or in addition to) the magnitude of the signals can be analyzed. In one implementation, the modulation frequency of the modulated signal exceeds the flicker fusion frequency, in order for a human observer to experience the indicator light 215 as steady. In this implementation, the modulation frequency could for example exceed 50 Hz.

The modulation of a modulated reset-state output signal 222b could be any kind of modulation, such as a square wave signal, another PWM signal or a saw-tooth signal. In one implementation, one of the values of the modulated signal is of the same potential as a DC potential to which the other end of reset switch 205 is connected. When the reset button 210 is in a released state, the input signal 350 will show periodic time slots during which the potential differs from this DC potential. When the reset button 210 is being pressed, the input signal 350 will instead correspond to this DC potential.

A modulated reset-state output signal 345b could also be beneficial in order to reduce the risk that a false signal at the I/O terminal 301 is detected as a reset operation. A false signal could for example be caused by a fault in the signal generator 325. Since the chance is slim that such false signal from the signal generator 325 has the same characteristics as the modulated reset-state output signal 345b, a constant potential at the I/O terminal 301 of approximately the value expected when the reset button 301 is being pushed, can more reliably be assumed to be the result of the pressing-down of the reset button 210.

In this embodiment wherein the reset-state output signal 345b is a modulated signal, step 405 of FIG. 4, wherein the indicator light 215 is switched on, comprises generating a modulated signal at the connection point 301. Step 415, wherein the reset is detected, comprises detecting if the potential at connection point 301 has changed from the modulated signal to a steady state signal, the steady state signal lasting for at least a predetermined period of time. As mentioned above, in some implementations, the signal detector 330 only detects a reset operation when the signal at connection point 301 has returned to the modulated signal.

In FIG. 6, an alternative way of schematically illustrating an embodiment of a first part 305 of a proximity switch 300 is shown. FIG. 6 shows the first part 305 comprising processing means 600 connected to a computer program product 605 in the form of a memory, as well as to transmitter 120; receiver 130; signal generator 325; signal detector 330 and to a second signal generator 610. Second signal generator 610 is for generating an OK-signal 355, and is, for illustration purposes, shown to be separate from the signal generator 325. However, signal generator 610 and signal generator 325 could, if desired, be physically implemented by the same signal generator.

The memory 605 comprises computer readable code means that stores a computer program, which, when executed by the processing means 600, causes the first part 305 of the proximity switch 300 to perform a method of operating the first part 305 of the proximity switch 300. An embodiment of a part of such method is illustrated in FIG. 4. In other words, the proximity switch 300 may in this embodiment be implemented with the help of corresponding program modules of the computer program stored in the memory 605.

By execution of the software stored in memory 605, the processing means 600 is arranged to execute the operation of first part 305 of the proximity switch 300: The processing means 600 is arranged to receive a signal 617 from the receiver 130, the signal 617 indicating that a response signal 135 has been received. The processing means is further arranged to check whether a signal 617, indicating receipt of a response signal 135, is received when expected (cf. steps 410 and 435 of FIG. 4). In response to the absence of an expected signal 617, the processing means 600 of FIG. 6 is arranged to instruct the signal generator 325, via signal 620, to change the signal 505 at the I/O interface 301 from a normal-state output signal 345a to a reset-state output signal 345b, which will cause a connected indicator light 215 to switch on (cf. step 405 of FIG. 4). Meanwhile, the signal detector 330 monitors an electric potential at the I/O interface 301, to check whether the potential changes in the manner expected when a reset operation has been performed (cf. step 415 of FIG. 4). The signal detector 330 is arranged to send a signal 625, indicating that a reset operation has been performed, to the processing means 600 in response to having detected a reset operation. In response to receiving the signal 625, which is indicative of a performed reset operation, the processing means 600 is arranged to instruct the signal generator 325, via signal 635, to applying a normal-state output signal 345a at the I/O terminal 301 so that the indicator light 215 is turned off. (cf. step 420 of FIG. 4). If desired, signal 635 and signal 620 could use the same physical connection.

The processing means if furthermore arranged to receive a prompting signal 153 (cf. step 425 of FIG. 4), and to instruct the signal generator 610 to output a CLOSED signal 155 if the if both an prompting signal 153 has been received, AND a response signal 135 has been received, either when expected, or if received later, the received response signal 135 was followed by a detected reset operation.

In the embodiment of the first part 305 which is shown in FIG. 6, the transmitter 120 is arranged to transmit a query signal 125 at regular intervals when the proximity switch 300 is turned on. In another implementation, the processing means 600 is arranged to instruct the transmitter 120, to transmit a query signal 125 at periodic intervals In FIG. 6, the signal generators 325 and 610, as well as the signal detector 330, are shown to be entities separate from the processing means 600. However, in an alternative implementation, at least parts of the signal generators 325, 620 and/or the signal detector 330 form part of the processing means.

The processing means 600 could be one or more processors. In one embodiment, two or more processors are employed for redundancy purposes. Similarly, two or more signal detectors 330, and/or two or more signal generators 325/610, could be used for redundancy purposes. Furthermore, two or more communications I/O interfaces 302 could be employed for redundancy purposes, connected to the same or different processors. The computer program product 605 could be any type of non-volatile computer readable means, such as a hard drive, a flash memory, an EEPROM (electrically erasable programmable read-only memory) a DVD disc, a CD disc, a USB memory, etc.

In another embodiment, the reset mechanism 320 is implemented by means of hardware only, in the form of electronic components.

Figure 7:
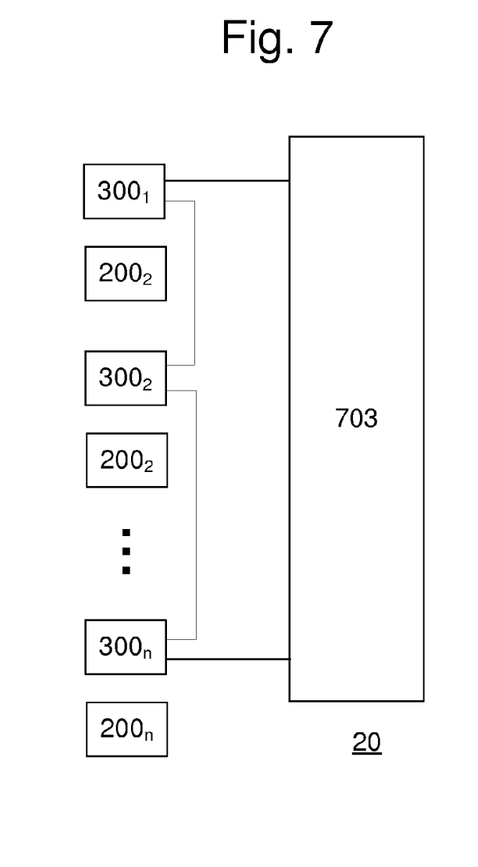
FIG. 7 shows an embodiment of a machine safety system wherein a plurality of non-contact proximity switches according to the invention are connected to a safety controller.

FIG. 7 schematically illustrates a machine safety system 20 wherein a plurality of inventive non-contact proximity switches $300_1$ to $300_n$ are connected in series to a safety controller 203. By including a reset mechanism 320 in the proximity switch 300, each proximity switch 300 can be equipped with its own reset button 210. If desired, a safety controller 203 can be connected both to proximity switches 300 having a reset mechanism 320, and to prior art proximity switches 100 and other sensors which do not have a reset mechanism. To cater for the sensors which do not have a reset mechanism, the safety controller 203 could then be equipped with a reset mechanism and connected to a reset circuit. However, if all sensors which are connected to the safety controller 203 have their own reset mechanism, the safety controller 203 does not need to be equipped with a reset function.

In the embodiment of machine safety system 20 shown in FIG. 7, the proximity switches $300_1$ to $300_n$ are connected in series. In another implementation, such as for example in a type of airlock, proximity switches $300_1$ to $300_n$ are connected in parallel to a safety controller 203. In yet another implementation, a machine safety system 20 simply consists of a stand-alone proximity switch 300 which is arranged to monitor whether two parts of monitored device are in the proximity of each other.

In the embodiment of the invention shown in FIGS. 3 and 5, the reset circuit 200 is external to the proximity switch 300. However, if desired, the reset circuit 200 could be physically implemented together with the first part 305 of the proximity switch 300, for example in the same housing, so that the indicator light 215 and the reset button 210 will be physically located at an outside wall of the first part 305 of the proximity switch 300.

The non-contact proximity switch 300 typically further comprises connections for the connection of a power supply.

The above description has been made in terms of proximity switches wherein proximity is detected by means the transmission of query- and respons signals. The transmitters 120 and 150 could for example be radio transmitters, or transmitters arranged to transmit other types of signals such as infrared light signals or microwave signals. Similarly, receivers 140 and 130 could be radio receivers, infrared-light receivers, microwave receivers, etc. Furthermore, in FIGS. 3 and 6, the transmitter 120 is shown to be physically separate from the receiver 130, and the transmitter 150 is similarly shown to be physically separate from the receiver 140. However, if desired, transmitter 120 and receiver 130 could be implemented as a transceiver, and/or transmitter 150 and received 140 could be implemented as a transceiver.

The invention is also applicable to proximity switches wherein proximity is detected by other means, for example by means of a magnetic element in the second part 310 and a magnetic field sensor in the first part 305. Examples of magnetic field sensors include REED contacts and hall elements. In such implementations of the proximity switch 300, neither the second part 310, nor the first part 305, needs to include a transmitter. Instead of a receiver, the first part 305 can include a magnetic field sensor which typically generates a response signal when proximity to the second part is detected. In one implementation, such response signal is generated at periodic intervals.

Although various aspects of the invention are set out in the accompanying claims, other aspects of the invention include the combination of any features presented in the above description and/or in the accompanying claims, and not solely the combinations explicitly set out in the accompanying claims.

One skilled in the art will appreciate that the technology presented herein is not limited to the embodiments disclosed in the accompanying drawings and the foregoing detailed description, which are presented for purposes of illustration only, but it can be implemented in a number of different ways, and it is defined by the following claims.

The invention claimed is:

1. A non-contact proximity switch having a first part and a second part, wherein
the first part is arranged to be connected to a reset circuit comprising an indicator light and a reset switch having a reset button;
the first part comprises a reset mechanism for machine safety;
the reset mechanism comprises a signal generator and a signal detector; and
the signal detector is arranged to detect when the state of a connected reset switch corresponds to a state where the reset button is being pressed, characterized in that
the first part comprises a first I/O interface arranged to be connected to said reset circuit;
the reset mechanism is arranged to, upon a detected absence of a response signal from the second part, generate a modulated signal at an output of the first I/O interface; and
the signal generator is arranged to, upon indication that a reset is required, generate a signal so as to switch-on said indicator light.

2. The non-contact proximity switch of claim 1,
the first part further comprises:
a first I/O interface arranged to be connected to said reset circuit;
the reset mechanism is arranged to, upon a detected absence of a response signal from the second part:
alter the output from the signal generator so that a signal at an output of said first I/O interface changes;
detect a re-appearing response signal from the second part;
detect a reset operation, the detection comprising detecting, in the signal detector, that a signal at an input of the I/O interface has changed to a signal, which corresponds to the reset button being pressed.

3. The non-contact proximity switch of claim 1, wherein
the first part further comprises a first I/O interface arranged to be connected to said reset circuit; and
the signal detector is arranged to detect a reset operation if the potential at the input of said I/O interface has changed to a potential corresponding to the reset button being pressed.

4. The non-contact proximity switch of claim 1, wherein
the output and the input of the first I/O interface is provide with a single connection point;
an output of the signal generator is connected to said single connection point;
and an input of the signal detector is connected to said single connection point.

5. The non-contact proximity switch of claim 1
wherein the reset mechanism is at least partly implemented by means of a processor, the processor being arranged to:
detect an absence of an expected response signal from the second part;
instruct the signal generator to generate a signal so as to switch-on said indicator light;
detect a re-appearing response signal and
detect a reset operation.

6. The non-contact proximity switch of claim 5, wherein said at least one processor is arranged to perform the detection of a reset operation by
receiving a signal indicative of the potential at the input of the first I/O interface;
comparing said signal with a potential expected, at said input, if the reset button of the reset circuit which is connected to the non-contact proximity switch is being pressed; and
if said signal represents said expected potential, then
checking whether the duration of said expected potential at said input exceeds a pre-determined period of time; and
detecting, via said signal indicative of the potential at said input, that the potential has returned to a potential expected when said reset button has been released.

7. The non-contact proximity switch of claim 1, further comprising
a signal generator arranged to generate a CLOSED-signal at a second I/O interface in response to the reset mechanism having detected a re-appearing response signal and a detected reset operation.

8. The non-contact proximity switch of claim 7, wherein said signal generator arranged to generate a CLOSED-signal is arranged to only generate a CLOSED-signal if both an input signal and a response signal has been received, the response signal either having been received at an expected point of time, or if received later, the received response signal was followed by a detected reset operation.

9. The non-contact proximity switch of claim 7, wherein said output arranged to output a CLOSED-signal is a data port arranged to be connected to a data bus; and
the signal generator to which said data port is connected is arranged to generate said CLOSED-signal as a digital signal.

10. The non-contact proximity switch of claim 1, further comprising a housing wherein said housing houses:
the reset mechanism; and
a receiver for receiving a response signal from the second part.

11. A machine safety systems comprising a safety controller and at least two non-contact proximity switches according to claim 1.

12. The machine safety system of claim 11 further comprising a signal generator arranged to generate a CLOSED-signal at a second I/O interface in response to the reset mechanism having detected a re-appearing response signal and a detected reset operation, wherein
at least two of the at least two non-contact proximity switches are connected to a safety controller via said second I/O interface connected to said signal generator arranged to generate a CLOSED-signal.

* * * * *